(12) United States Patent
Steensgaard-Madsen

(10) Patent No.: US 8,319,673 B2
(45) Date of Patent: Nov. 27, 2012

(54) A/D CONVERTER WITH COMPRESSED FULL-SCALE RANGE

(75) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 44 days.

(21) Appl. No.: 12/861,696

(22) Filed: Aug. 23, 2010

(65) Prior Publication Data

US 2011/0285569 A1 Nov. 24, 2011

Related U.S. Application Data

(60) Provisional application No. 61/345,964, filed on May 18, 2010.

(51) Int. Cl.
*H03M 1/00* (2006.01)

(52) U.S. Cl. ........ 341/139; 341/118; 341/120; 341/131; 341/155

(58) Field of Classification Search .......... 341/118–121, 341/139, 155, 131
See application file for complete search history.

(56) References Cited

U.S. PATENT DOCUMENTS

| | | | | |
|---|---|---|---|---|
| 5,525,984 A * | 6/1996 | Bunker | | 341/131 |
| 5,745,060 A * | 4/1998 | McCartney et al. | | 341/120 |
| 5,757,858 A * | 5/1998 | Black et al. | | 375/295 |
| 5,793,319 A * | 8/1998 | Ard | | 341/120 |
| 6,373,423 B1 * | 4/2002 | Knudsen | | 341/159 |
| 6,400,302 B1 * | 6/2002 | Amazeen et al. | | 341/172 |
| 6,686,957 B1 * | 2/2004 | Johnson et al. | | 348/222.1 |
| 6,943,721 B1 * | 9/2005 | Aswell et al. | | 341/172 |
| 7,102,424 B2 * | 9/2006 | Vorenkamp | | 327/540 |
| 7,289,052 B1 * | 10/2007 | Atris et al. | | 341/155 |
| 2003/0231130 A1 * | 12/2003 | Confalonieri et al. | | 341/172 |
| 2005/0035895 A1 * | 2/2005 | Byrne et al. | | 341/162 |
| 2005/0068211 A1 * | 3/2005 | Arai et al. | | 341/138 |
| 2007/0247345 A1 * | 10/2007 | Atris et al. | | 341/155 |
| 2007/0252747 A1 * | 11/2007 | Lyden et al. | | 341/161 |
| 2008/0084340 A1 * | 4/2008 | Hurrell | | 341/131 |
| 2008/0272951 A1 * | 11/2008 | Li Puma et al. | | 341/158 |
| 2011/0115661 A1 * | 5/2011 | Steensgaard-Madsen | | 341/155 |

* cited by examiner

*Primary Examiner* — Linh Nguyen

(74) *Attorney, Agent, or Firm* — Patent Law Group LLP; Brian D. Ogonowsky

(57) ABSTRACT

An embodiment of an analog-to-digital converter system is described wherein an analog voltage signal Vin(t) is provided by an input amplifier. The analog signal Vin(t) has a predetermined full-scale range that is less wide than a reference voltage (Vref) range used by a downstream ADC to derive a first digital (numerical) representation D1($k$) of a sampled value Vin($k$) of the analog signal Vin(t). The first digital representation has N bits. A digital circuit then converts the N-bit D1($k$) code to a second numerical representation D2($k$) of the sampled analog voltage Vin($k$) with respect to the full-scale range of the ADC system. The D2($k$) code has P bits of resolution, which may be less than N bits. The P-bit D2($k$) code representing Vin($k$) is the output of the ADC system. Therefore, the width of the reference voltage range applied to the ADC is greater than the width of the system's full-scale range at the output of the system.

20 Claims, 4 Drawing Sheets

A/D CONVERTER WITH COMPRESSED FULL-SCALE RANGE

FIELD OF THE INVENTION

This invention relates to analog-to-digital converters (ADCs), and in particular to changing a full-scale range of an ADC.

BACKGROUND

FIG. 1 shows a typical (prior art) analog-to-digital converter (ADC) system, which may operate from a single two-terminal power supply source providing a high supply voltage bias (say, 5V) and a low supply voltage bias (0V, ground). An amplifier circuit [100] is an active circuit providing an analog voltage signal Vin(t). Amplifier circuit [100] receives the high supply voltage bias (5V) via a first power supply terminal [101] and the low supply voltage bias (0V) via a second power supply terminal [102]. The analog voltage signal Vin(t) is provided as an input voltage signal to an ADC [103] that samples the analog voltage signal to acquire a sampled analog voltage Vin(k). ADC [103] provides a numerical (digital) representation D1($k$) corresponding to (representing) the sampled analog voltage Vin(k). ADC [103] may use a successive-approximation algorithm to derive D1($k$), but many other types of analog-to-digital conversion methods/circuits are known to those skilled in the art. ADC [103] receives a first reference voltage potential, Vref1, and a second reference voltage potential, Vref2, via a first reference voltage terminal [104] and a second reference voltage terminal [105]. The first reference voltage potential, Vref1, may be substantially the same as the low supply voltage bias (0V), and the second reference voltage potential, Vref2, may be provided by a conventional bandgap reference voltage generator circuit (not shown) connected to (powered by) the two-terminal power source. In a typical application, Vref2 may be slightly lower than the high supply voltage bias, for example Vref2=4.096V. ADC [103] is also connected to (powered by) the two-terminal power source via power supply terminals [107] and [106].

Numerical representation D1($k$) may represent the sampled analog voltage Vin(k) with a resolution of N bits, where N is an integer number, for example N=4, 8, 16, or 18. D1($k$) may be encoded in a straight-binary format, having two-to-the-power-of-N ($2^N$) distinct numerical values: 0, 1, 2, ..., ($2^N$)–2, ($2^N$)–1. A normalized numerical representation may be derived by dividing the straight-binary representation by $2^N$, whereby the possible numerical values are spaced uniformly with a numerical separation of $1/(2^N)$ in a numerical full-scale range having a lower limit, 0, and an upper limit, $1-1/(2^N)$. FIG. 2 shows the straight binary codes of D1($k$) produced by an N=4 bit ADC [103] for a range of values of the sampled analog signal Vin(k).

A reference voltage range is delimited by a lower limit (Vref1=0V) and an upper limit (Vref2=4.096V). N=4 bit ADC [103] effectively divides the reference voltage range in $2^N$=16 code-specific voltage ranges, each corresponding to a unique code and numerical value of D1($k$), and each having a width equal to a least significant bit size. Sampled analog voltages Vin(k) greater than the upper limit of the reference voltage range, Vref2=4.096V, cause ADC [103] to saturate at a maximum digital code D1($k$)=1111. Similarly, sampled analog voltages Vin(k) smaller than the lower limit of the reference voltage range, Vref1=0V, cause ADC [103] to saturate at a minimum digital code D1($k$)=0000. These limits may be called saturation limits, which delimit a full-scale range of ADC [103].

A loss of information may occur if analog voltage signal Vin(t) exceeds the full-scale range of ADC [103]. Similarly, variations in Vin(k) that are smaller than the least significant bit size may not register (cause variations) in D1($k$), which may also result in a loss of information. Accordingly, to reduce any loss of information, it may be desirable to maximize a full-scale range of Vin(t) without causing ADC [103] to saturate. Specifically, to optimize a dynamic range (a measure of performance) for the system of FIG. 1, it may be desirable to select a full-scale range for Vin(t) such that it is substantially the same as the full-scale range of ADC [103].

If active circuit [100] providing Vin(t), reference voltage generator (not shown) providing Vref2, and ADC [103] are all supplied power from a single two-terminal power source (e.g., a single battery), terminals [102], [104], and [106] may all be connected to a low supply voltage bias (0V, ground) provided by the single two-terminal power source. An active circuit, such as amplifier circuit [100], may not be able to drive/provide an analog voltage signal Vin(t) close to its power supply bias voltages without a significant loss of fidelity (information), implying that a full-scale range of Vin(t) may have to be smaller than the reference voltage range, thus limiting/reducing the dynamic range. This type of limitation may be overcome by providing a second power source providing a third supply voltage bias, say –5V, connected to power supply terminal [102] to drive amplifier [100], but that option is associated with additional cost, physical volume, power dissipation, and other disadvantages.

It is an object of this invention to provide an analog-to-digital converter (ADC) that facilitates optimizing a dynamic range for an ADC system powered by a single two-terminal power source.

It is another object of the invention to provide an ADC having a full-scale range confined within the limits of a single power supply voltage range, such that an active circuit (powered by the single power supply) can provide with good fidelity a voltage signal utilizing the entire full-scale range.

It is another object of the invention to improve the utility (e.g., provide programmable saturation/full-scale limits) of ADCs incorporated in systems powered by one or more power sources.

Additional objects and advantages of the present invention will be apparent from studying the appended figures, description, and claims.

SUMMARY

An embodiment of an analog-to-digital converter system is described wherein an analog voltage signal Vin(t) is provided by an input amplifier. The analog signal Vin(t) has a full-scale range that is less wide than a reference voltage (Vref) range used by a downstream ADC to derive a first digital (numerical) representation D1($k$) of a sampled value Vin(k) of the analog signal Vin(t). The first digital representation has N bits.

A digital circuit then converts the N-bit D1($k$) code to a second numerical representation D2($k$) of the sampled analog voltage Vin(k) with respect to the full-scale range of the ADC system. The D2($k$) code has P bits of resolution, which may be less than N bits. The D2($k$) code representing Vin(k) is the output of the ADC system.

Therefore, the width of the reference voltage range applied to the ADC is greater than the width of the system's full-scale range at the output of the system.

The invention is particularly applicable where there is only a single power supply voltage and where, due to the saturation voltages of components, an amplified analog voltage signal cannot swing accurately in a full range of voltages delimited by the power supply rail voltages.

Other embodiments are described.

Accordingly, the invention comprises an analog-to-digital converter system having a first analog-to-digital converter providing a first numerical representation of a sampled analog voltage with respect to a reference voltage range, the reference voltage range being delimited by a first reference voltage potential and a second reference voltage potential, the system further including a digital circuit mapping the first numerical representation to derive a second numerical representation of the sampled analog voltage with respect to a full-scale range of the analog-to-digital converter system, wherein a width of the reference voltage range is greater than a width of the full-scale range at the output of the system.

BRIEF DESCRIPTION OF THE DRAWINGS

Elements that are the same or equivalent are labeled with the same numeral.

DETAILED DESCRIPTION

Figure 1:
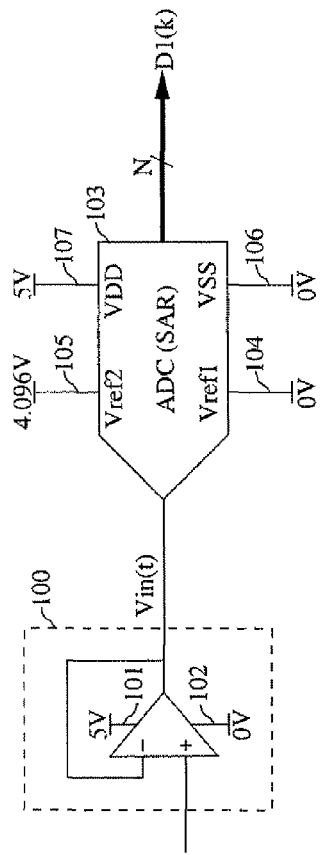
FIG. 1 illustrates a prior art analog-to-digital converter (ADC) system operating from a single power supply source (also powering a reference voltage generator, not shown).
Figure 2:
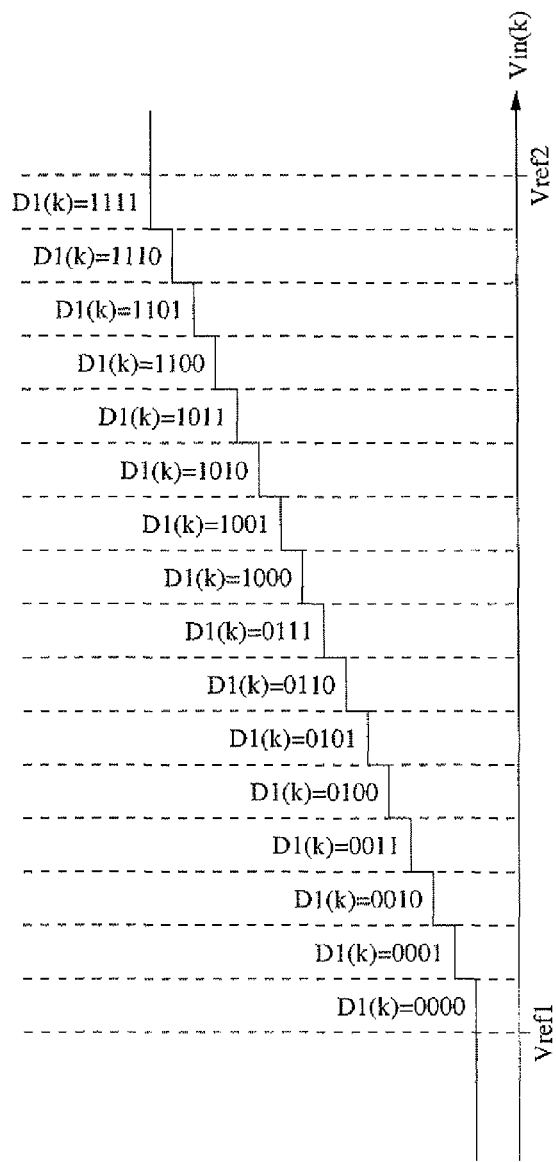
FIG. 2 illustrates a transfer characteristic for ADC [103] of FIG. 1 for a resolution of N=4 bits.
Figure 3:
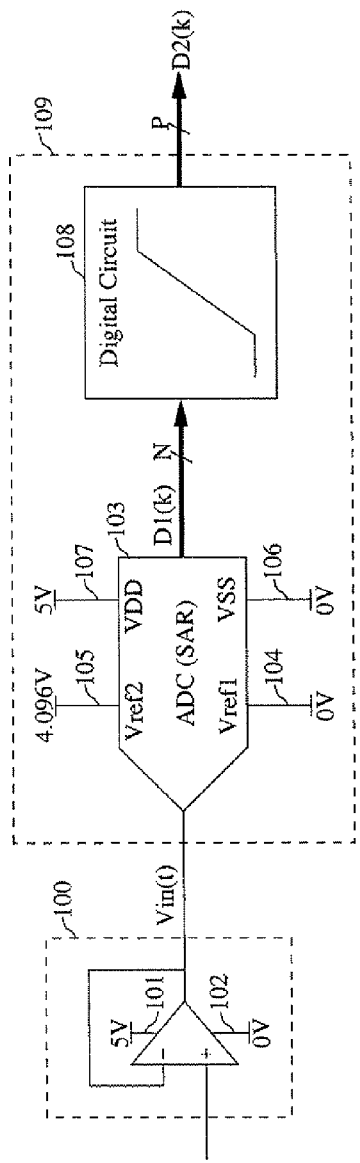
FIG. 3 illustrates an embodiment of the invention, wherein a digital circuit [108] scales and limits a first numerical representation D1(k) to effectively change the full-scale limits of an ADC [109] according to one aspect of the invention.

FIG. 3 shows a first embodiment of the invention. An amplifier circuit [100] and a first analog-to-digital converter (ADC) [103] are configured and operate as described previously for FIG. 1. An analog-to-digital converter system [109] comprises the first ADC and a digital circuit [108]. ADC [103] provides a first numerical (digital) representation D1(k) corresponding to (representing) a sampled analog voltage Vin(k) of analog voltage signal Vin(t). The first numerical representation D1(k) is provided as an input to digital circuit [108], which scales and limits D1(k) to generate a second numerical representation D2(k) provided as an output of ADC system [109]. ADC system [109] may be implemented on a single semiconductor die.

The second numerical representation D2(k) may be encoded in a straight-binary P-bit format, having two-to-the-power-of-P ($2^P$) distinct numerical values: 0, 1, 2, . . . , ($2^P$)−2, ($2^P$)−1. As described in more detail below, digital circuit [108] effectively adapts a full-scale range of ADC [109] such that it aligns with a selected full-scale range of Vin(t) provided by active amplifier circuit [100]. Accordingly, all ($2^P$) distinct codes of D2(k) may be utilized to represent a full-scale analog voltage signal Vin(t) when the ADC system of FIG. 3 operates from a single two-terminal power source (e.g., a single 5V battery).

In the first embodiment, Vin(t) is selected to utilize a selected full-scale signal voltage range delimited by 0.4096V (lower limit) and 3.6864V (upper limit), which corresponds to substantially one tenth (1/10) and nine tenths (9/10) of the reference voltage range delimited by Vref1=0V (lower limit) and Vref2=4.096V (upper limit). Amplifier circuit [100] can be designed (by those skilled in the art) to provide Vin(t) in the selected full-scale signal voltage range with good fidelity while operating from a single two-terminal 5V power source.

The ADC [103] performs digital encoding of a sampled value Vin(k) of Vin(t) to derive D1(k), using the full reference voltage range applied to ADC [103]. The full-scale range of the input signal Vin(t) is less than the full reference voltage range, according to decisions made in the design of amplifier [100] and the overall ADC system.

Figure 4:
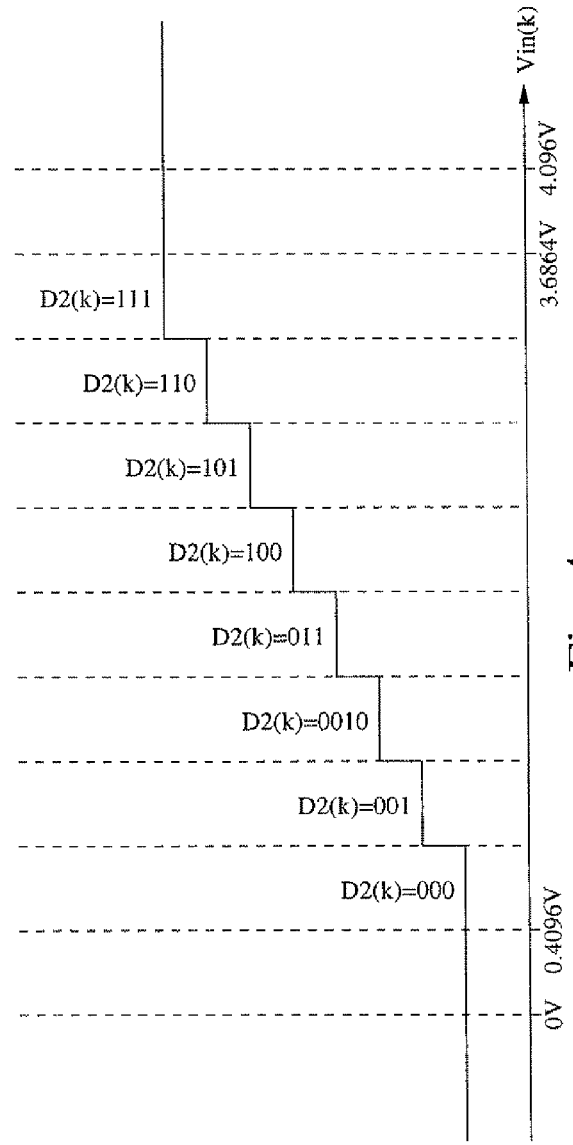
FIG. 4 illustrates a nominal transfer characteristic for ADC [109] of FIG. 3 for an embodiment where P=3.

An operation of digital circuit [108] is to scale and limit the first numerical representation D1(k) such that a full-scale range of ADC [109] corresponds to the selected full-scale signal voltage range for Vin(t). Specifically, in the first embodiment, D2(k) assumes a maximum numerical value, ($2^P$)−1, for Vin(k)=3.6864V, and D2(k) assumes a minimum numerical value, 0, for Vin(k)=0.4096V. FIG. 4 shows a nominal transfer characteristic of ADC system [109] when D2(k) has a resolution of P=3 bits. FIG. 4 shows that the full-scale range of ADC [109], from 0.4096V to 3.6864V, is segmented in $2^P$=8 code-specific voltage ranges, each corresponding to a unique value/code of D2(k), and each having a width equal to a least significant bit size. In another embodiment, the resolution of D2(k) may be much higher than P=3 bits, for example P may equal 8, 12, 16, 18, or 20.

Digital circuit [108] may be implemented as a combinatorial circuit, a clocked state machine, or using any other pertinent method or circuit. The design of such circuits is well known by those skilled in the art, and the transistor-level details do not need to be described in this context. An operation of digital circuit [108] is to map predefined codes of D1(k) to predefined codes D2(k). Such a function may be described in the required level of detail by a truth table. As will be described next, a typical truth table for digital circuit [108] may map several distinct codes of D1(k) to a single code of D2(k).

Figure 5:
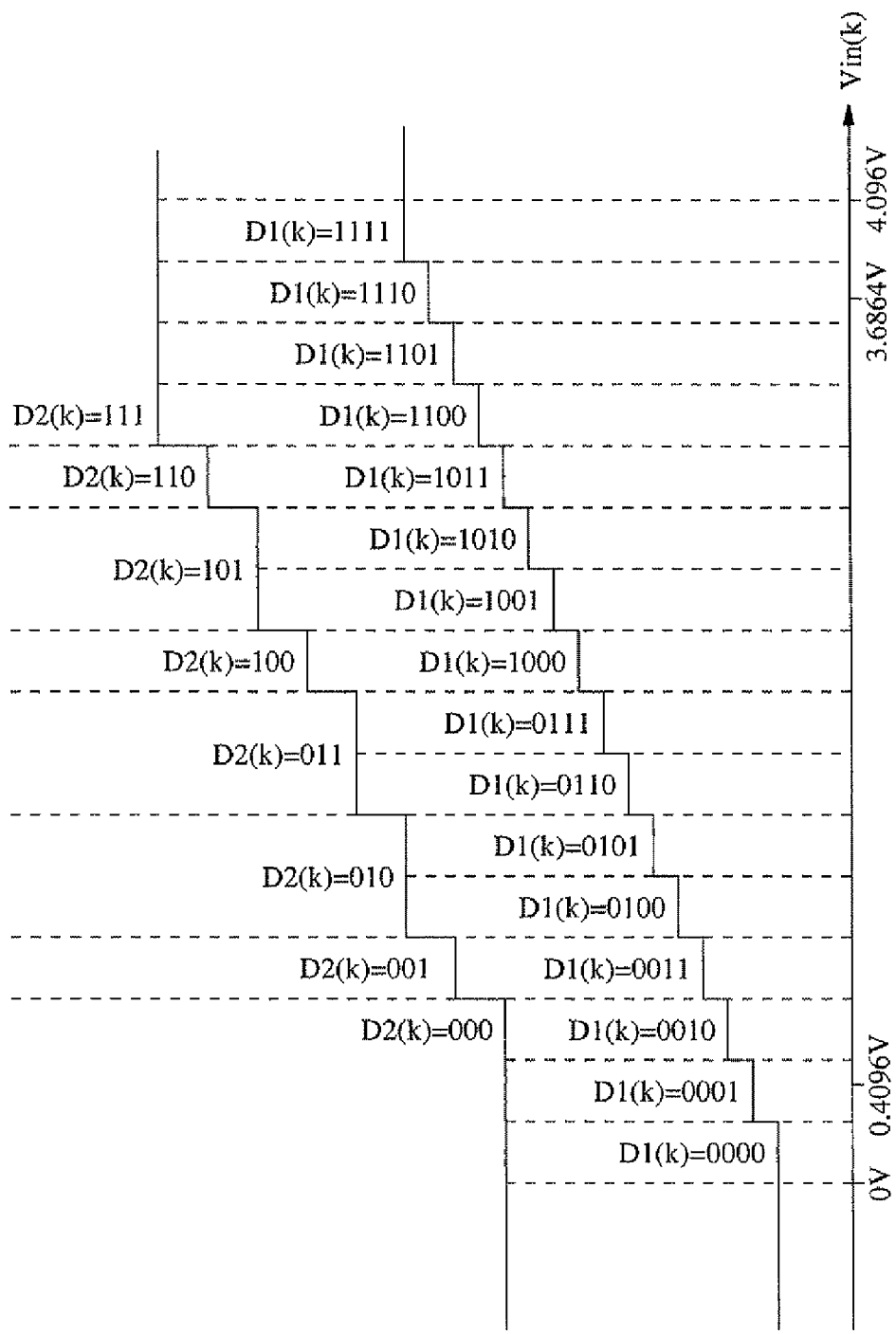
FIG. 5 illustrates an internal transfer characteristic and an external transfer characteristic for ADC [109] of FIG. 3 for an embodiment where N=4 and P=3.

FIG. 5 shows two transfer characteristics for another embodiment of ADC system [109] of FIG. 3, wherein a resolution of D1(k) is N=4 bits, and a resolution of D2(k) is P=3 bits. The resolutions of D1(k) and D2(k) will typically be much higher; low resolutions are used in FIG. 5 to better illustrate several aspects of the invention. The $2^N$=16 distinct values for D1(k) divide the reference voltage range (from Vref1=0V to Vref2=4.096V) in 16 code-specific voltage ranges, each nominally having a width equal to a first (internal) least significant bit size 4.096V/16=0.256V. FIG. 5 also reflects a truth table for digital circuit (showing which codes of D1(k) that map to each code of D2(k)). Specifically, as shown in FIG. 5, D1(k) codes 0000, 0001, and 0010 map to D2(k) code 000. D1(k)=0011 maps to D2(k)=001. D1(k) codes 0100 and 0101 map to D2(k)=010. D1(k) codes 0110 and 0111 map to D2(k)=011. D1(k)=1000 maps to D2(k)=100. D1(k) codes 1001 and 1010 map to D2(k)=101. D1(k)=1011 maps to D2(k)=110. Finally D1(k) codes 1100, 1101, 1110, and 1111 map to D2(k)=111. The transfer characteristic for D2(k) of FIG. 5 approximates the nominal transfer characteristic for D2(k) of FIG. 4, but they are not identical. For example, in FIG. 4, D2(k) transitions from code 000 to code 001 at a voltage Vin(k)=2/10*Vref2, whereas in FIG. 5 the transition occurs at a nearby voltage Vin(k)=3/16*Vref2. The 7 transition points (voltages) for D2(k) are chosen (by design of the truth table for digital circuit [108]) from a set of 15 transition points for D1(k) such that the effective transfer characteristic for D2(k) (FIG. 5) approximates the targeted transfer characteristic for D2(k) (FIG. 4). A least significant bit size of ADC [109] in FIG. 5 may be said to be (approximately) (3.6864V−0.4096V)/8=0.4096V. Accordingly, for this embodiment, the least significant bit size of ADC [109] is greater than the least significant bit size of ADC [103].

A truth table for digital circuit [108] may alternatively be described (sometimes more compactly) as an algorithm implemented by digital circuit [108]. For example, the truth table reflected by FIG. 5 may be described indirectly by a two-step scaling-and-limiting operation:

STEP 1: multiply the normalized straight-binary N-bit value of D1(k) by 5/4 and subtract 1/8
STEP 2: truncate the result from step 1 to the nearest normalized straight-binary P-bit value D2(k).

For example, for D1(k)=0101 the normalized value is 5/16, and STEP 1 yields the result 25/64−1/8=17/64. In STEP 2, the possible normalized 3-bit values of D2(k) are 0/8, 1/8, 2/8, 3/8, 4/8, 5/8, 6/8, and 7/8, of which 2/8 is closest to 17/64. Accordingly, in the corresponding truth table, D1(k)=0101 maps to D2(k)=010. In this example, STEP 1 is a process involving "scaling" a first numerical representation D1(k), and STEP 2 is a process involving "limiting" the result of STEP 1 to derive a second numerical representation D2(k). The limiting element in step 2 stems from imposing a lower and an upper limit on the numerical values used to represent D2(k).

In another embodiment, step 1 may be the process of multiplying a normalized straight binary N-bit value of D1(k) by 10/9 and then subtracting 1/9 to describe a truth table for digital circuit [108] that sets a lower saturation limit at Vref2/10 and an upper saturation limit at Vref2 (here assuming Vref1=0V). In other words, a full-scale range of ADC [109] in one embodiment may be chosen such that it aligns with the reference voltage range at one end (e.g., upper limit) but not at the other end (lower limit set at Vref1+(Vref2−Vref1)/10). The exact same truth table may be described by a step 1 wherein 1/10 is subtracted from a normalized straight binary N-bit value of D1(k) and the result from that is multiplied by 10/9.

It may be advantageous to implement digital circuit [108] as an algorithmic circuit that substantially implements operations equivalent to the calculations described herein as steps 1 and 2. It will be understood that the operation of digital circuit [108] can be described in a large number of ways, and that substantially equivalent operations of digital circuit [108] can be achieved by modifying an algorithm or circuit while exercising this invention.

Digital circuit [108] may be programmable, and a full-scale range of ADC [109] may be selected from a plurality of selectable full-scale ranges. For example, for Vref1=0 and Vref2=Vref, a first selectable full-scale range may be from Vref/10 to 9Vref/10; a second selectable full-scale range may be from Vref/10 to Vref; and a third selectable full-scale range may be from 0V to Vref. Each selectable full-scale range may correspond to a different truth-table for digital circuit [108]. Any number (one or more) of full-scale ranges may be selectable.

In FIG. 5, each transition point of D2(k) aligns with a transition point of D1(k). It may be advantageous to reduce a least significant bit size of D1(k) to add additional transition points that may be selected as transition points for D2(k) by design of a truth table for digital circuit [108]. In other words, it may be advantageous that a resolution N of D1(k) be several bits higher than a resolution P of D2(k). Increasing the (internal) resolution N of D1(k) with respect to the (external) resolution P of D2(k) may be straight-forward when design requirements (such as required accuracy of parameter matching, noise levels, et cetera) are evaluated with respect to the external resolution P. For example, if N is 4 bits higher than P, several distinct codes of D1(k) will map to each unique code of D2(k), and a "no-missing-codes" performance of ADC [109] can be achieved even if internal ADC [103] is imperfect and may not produce all possible codes of D1(k). Specifically, for example, if the resolution of D1(k) is increased from 4 bits (as shown in FIG. 5) to 7 bits, a truth table for digital circuit [108] can be selected such that a resulting characteristic for D2(k) (corresponding to that shown in FIG. 5) will closely resemble the targeted nominal characteristic for D2(k) shown in FIG. 4.

In an embodiment where ADC [103] is a successive-approximation-register (SAR) ADC [103], the resolution of D1(k) can be increased by several bits by appending bit test cycles (discussed next). The operation of SAR ADCs is well understood by those skilled in the art, and only a brief summary of the operation of a SAR ADC is necessary in this context.

Figure 6:
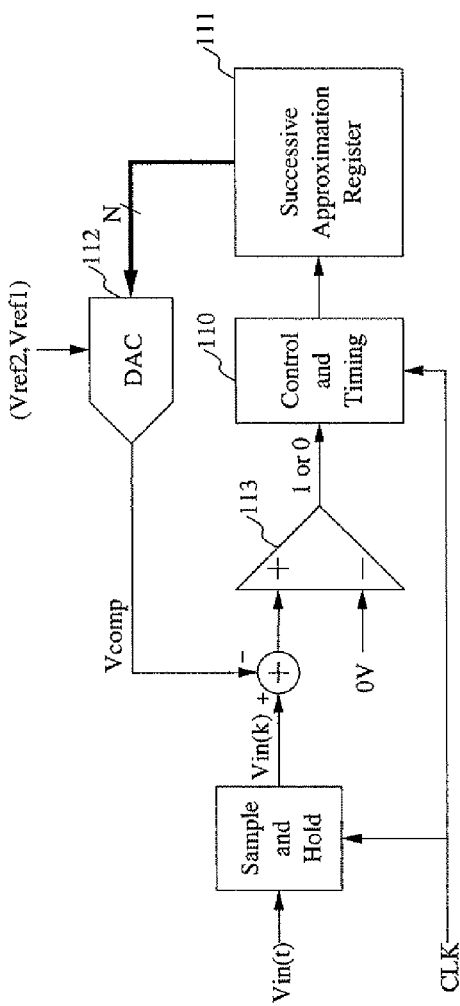
FIG. 6 illustrates a successive-approximation ADC [103] that can be used in one embodiment of the invention.

In FIG. 6, a sampled analog voltage Vin(k) is acquired by sampling an analog voltage signal Vin(t) in response to a clock signal CLK. A control and timing circuit [110] controls the contents of an N-bit successive-approximation register (SAR) [111], which is updated in each step of a series of N steps called bit test cycles. At the end of the Nth bit test cycle, SAR [111] stores a representation D1(k) of the sampled analog voltage Vin(k). A digital-to-analog converter (DAC) [112] is used to generate (in each bit test cycle) a comparison voltage Vcomp corresponding to a value in the SAR [111] and the reference voltage range (Vref1 to Vref2). DAC [112] may incorporate an array of binary-weighted (or equivalently scaled) capacitors, which may also be used to store the sampled analog voltage Vin(k). Several implementations are known to those skilled in the art. A comparator circuit [113] is used to determine whether or not a comparison voltage Vcomp is greater than the sampled analog voltage Vin(k), and communicates a '1' or a '0' to the control and timing circuit [110]. A successive-approximation algorithm may use a binary search process wherein a width of a range of uncertainty (RoU) is reduced by a factor of two in each bit test cycle. The operation relies on Vin(k) being within the RoU for each bit test cycle. For example, in a first bit test cycle, Vin(k) is compared to a midpoint of a first RoU (Vref1 to Vref2) by setting Vcomp=(Vref1+Vref2)/2. If, on the one hand, comparator [113] determines that Vin(k) is greater than the midpoint of the first RoU, then a first (most significant) bit in the SAR [111] is set to '1', and a second RoU is selected as the upper half of the first RoU. If, on the other hand, comparator [113] determines that Vin(k) is not greater than the midpoint of the first RoU, then the first bit in the SAR [111] is set to '0', and the second RoU is selected as the lower half of the first RoU. In the next (second) bit test cycle, Vin(k) is compared to a midpoint of the selected second RoU, and the result thereof determines the next (second) bit in the SAR [111] and whether a third RoU is selected as the upper or lower half of the second RoU. The process continues in this manner for N bit test cycles, whereby an N-bit representation D1(k) of Vin(k) is derived.

The resolution of D1(k) is increased by one bit for each bit test cycle and may (in principle) be made arbitrarily high. Some successive-approximation algorithms deviate from the described binary search process, and many variations are known by those skilled in art.

A resolution of the first numerical representation D1(k) in FIG. 3 may be increased without adding bit test cycles, or otherwise increasing the resolution of a core ADC.

Figure 7:
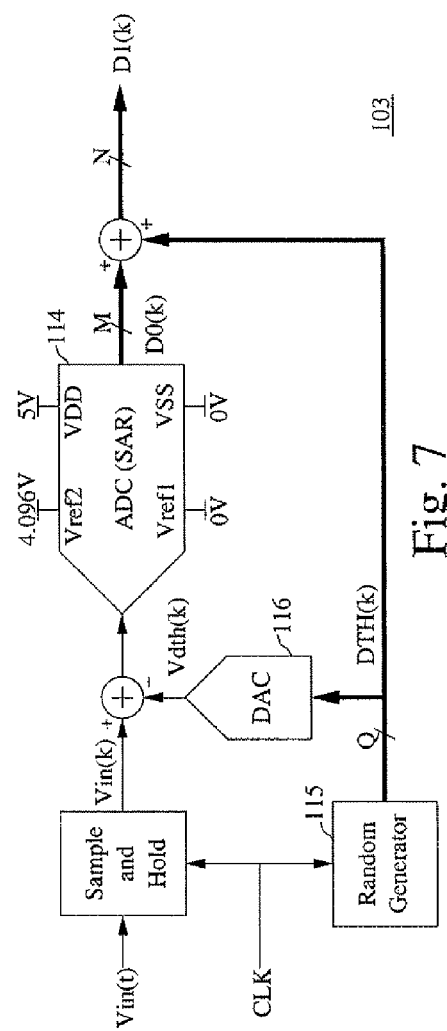
FIG. 7 illustrates an N-bit ADC [103] incorporating a Q-bit dither signal to increase the resolution M of ADC [114], that can be used in another embodiment of the invention.

FIG. 7 shows ADC [103] of FIG. 3 for another embodiment wherein a dithering method is used to effectively increase the resolution of D1(k). ADC [103] of FIG. 7 incorporates a conventional SAR ADC [114] using M bit test cycles to derive M-bit codes D0(k). In another embodiment ADC [114] may be another type of ADC, for example, a pipeline, a folding, a sub-ranging, or any other type of ADC. In the embodiment of FIG. 7, an analog voltage signal Vin(t) is sampled to acquire a sampled analog voltage Vin(k) in response to a clock signal CLK. The CLK signal also triggers a random generator [115] that provides a digital dither value DTH(k) having Q bits of resolution. The random generator [115] is triggered once for each sampled voltage Vin(k) acquired of Vin(t). Accordingly, a new digital dither value DTH(k) is provided for each new value of D1(k). A DAC [116] receives the digital dither value DTH(k) and provides an analog dither voltage Vdth(k). SAR ADC [114] provides an M-bit numerical value D0(k) representing a difference of (a combination of) the sampled analog voltage Vin(k) and the analog dither voltage Vdth(k). A numerical value of DTH(k) is added to a numerical value of D0(k) to obtain a numerical representation D1(k) of Vin(k). A transfer characteristic of DAC [116] may be selected such that a numerical gain function from DTH(k) to D1(k) is nominally zero. For example, a positive value of DTH(k) may tend to decrease a value of D0(k). A numerical gain function from DTH(k) to D1(k) is substantially zero (on average) when the numerical decrease in D0(k) caused by DTH(k) is substantially the same as the numerical value of DTH(k). The digital dither value DTH(k) may be said to induce an offset in D0(k), and the offset may be substantially cancelled by combining DTH(k) and D0(k) to derive D1(k).

The resolution Q of DTH(k) may be relatively low, say Q=5, and a numerical full-scale range of DTH(k) may be much smaller than a numerical full-scale range of D0(k). For example, a (normalized) numerical full-scale range of D0(k) may be substantially 0 to 1, and a smallest numerical separation between values of D0(k) may be $1/(2^M)$. A numerical full-scale range of DTH(k) may be substantially 0 to $2/(2^M)$ and a smallest numerical separation between values of DTH (k) may be $(1/16)/(2^M)$, or 16 times smaller than the numerical separation between values of D0(k). Accordingly, the numerical full-scale range of D1(k) is substantially 0 to 1 with a numerical separation between values of $(1/16)/(2^M)$. The numerical full-scale range is substantially determined by D0(k), and the numerical separation is substantially determined by Q(k).

Accordingly, ADC [103] may have many more transition points (voltages) than ADC may have on its own. As discussed previously, an increased number of transition points may be desirable for devising a truth table for digital circuit [108] leading to an overall improved characteristic for ADC [109] and D2(k) in FIG. 3. The resolution M of ADC [114] in FIG. 7 may be selected such that a least significant bit size of ADC [114] is comparable to (or smaller than) a noise level, for example a thermal noise level.

Random generator [115] generates a sequence of digital dither values DTH(k), which collectively may be considered as a digital dither signal. The digital dither signal may be a true white noise random signal, but it may also be a sequence generated by a simple linear-feedback-shift-register (LFSR) or cellular-automata-shift-register (CASR) random generator. A sequence provided by a LFSR and/or CASR random generator is not truly random, but it may be described as a pseudo random sequence. Whereas a truly random signal may be difficult to generate, LRSF and CASR sequences are relatively simple to generate, and the statistical qualities of a pseudo random sequence may be improved (if necessary) by employing any number of methods known to those skilled in the art. In ADC [103] of FIG. 7, each value of DTH(k) is selected from a sequence that is at least pseudo random (e.g., it may be a CASR sequence).

Numerous variations of the invention are envisioned, and the embodiments described herein are merely examples of several preferred embodiments. The best choice of circuitry depends on the specific application, the available types of semiconductors, reliability voltage limits, silicon area, cost, and many other factors and considerations typically involved in the design of an integrated circuit. For example, without limitation, ADC [103] in FIG. 3 may be implemented using any method and circuit technique suitable for analog-to-digital conversion. The described reference voltage potentials and generator circuitry are illustrative and exemplary, and may be modified in any number of ways. For example, the lower reference potential Vref1 need not be the same as the low supply voltage bias. The invention may be embodied in ADC systems powered by one or more power sources of any type, including batteries and regulated power supplies. The first and second numerical representations, D1(k) and D2(k), may be represented using binary or non-binary (e.g., floating point) coding, of any resolution, and using any number (including non-power-of-two) of distinct numerical values. Likewise, digital circuit [108] may be implemented in many ways, including some which cannot be described fully by a truth table (e.g. a noise-shaping truncation process may be incorporated).

Accordingly, while particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. An analog-to-digital converter system comprising:
    a generator circuit configured to generate a digital dither code selected from a sequence of digital dither codes that is at least pseudo random;
    a first circuit for offsetting a sampled analog voltage using the digital dither code;
    a first analog-to-digital converter configured to provide a first digital code representing the sampled analog voltage with an offset induced by the digital dither code;
    a combiner configured to combine the first digital code and the digital dither code to substantially cancel the offsetting of the sampled analog voltage, the combiner providing a first numerical representation of the sampled analog voltage with respect to a reference voltage range; and
    a digital circuit configured to scale and truncate the first numerical representation to derive a second numerical representation of the sampled analog voltage with respect to a full-scale range of the analog-to-digital converter system,
    wherein a width of the reference voltage range is greater than a width of the full-scale range, and
    wherein a least significant bit size of the first numerical representation is smaller than a least significant bit size of the second numerical representation.

2. The analog-to-digital converter system of claim 1 wherein the first analog-to-digital converter and the digital circuit are implemented on a single semiconductor die.

3. The analog-to-digital converter system of claim 1 wherein the least significant bit size of the first numerical representation is equal to a least significant bit size of the digital dither code.

4. The analog-to-digital converter system of claim 3 wherein a least significant bit size of the first digital code is larger than the least significant bit size of the first numerical representation.

5. The analog-to-digital converter system of claim 1 wherein the digital circuit is configured to implement a truth table defining a scaling-and-limiting operation.

6. The analog-to-digital converter system of claim 4 wherein the first analog-to-digital converter derives the first digital code by successive approximation in a first number of bit test cycles that is less than a second number of bits in the first numerical representation of the sampled analog voltage.

7. The analog-to-digital converter system of claim 1 wherein the first analog-to-digital converter derives the first digital code by successive approximation in a first number of bit test cycles that is less than a second number of bits in the first numerical representation of the sampled analog voltage.

8. The analog-to-digital converter system of claim 7 further comprising an active circuit providing an analog voltage signal being sampled to derive the sampled analog voltage, the active circuit having a power supply terminal substantially biased at a first reference voltage potential delimiting the reference voltage range.

9. The analog-to-digital converter system of claim 7 further comprising an active circuit providing an analog voltage signal being sampled to derive the sampled analog voltage, the active circuit and the first analog-to-digital converter being powered by a two-terminal power source.

10. The analog-to-digital converter system of claim 1 wherein the digital circuit is configured to scale the first numerical representation of the sampled voltage by a non-integer multiplication factor.

11. The analog-to-digital converter system of claim 1 wherein a saturation limit of the first numerical representation is the same as a saturation limit of the second numerical representation.

12. The analog-to-digital converter system of claim 1 wherein the digital circuit is programmable and the full-scale range is selected by programming from a plurality of selectable full-scale ranges.

13. The analog-to-digital converter system of claim 12 wherein the plurality of selectable full-scale ranges includes a second full-scale range substantially equal to the reference voltage range.

14. The analog-to-digital converter system of claim 1 further comprising a digital-to-analog converter configured to receive the digital dither code.

15. The analog-to-digital converter system of claim 14 wherein an output of the digital-to-analog converter is combined with the sampled analog voltage to induce the offset in the first digital code.

16. The analog-to-digital converter system of claim 1 wherein the digital circuit is configured to scale the first numerical representation by a factor of five quarters.

17. The analog-to-digital converter system of claim 1 wherein the width of the full-scale range is eighty percent of the width of the reference voltage range.

18. The analog-to-digital converter system of claim 1 wherein the first analog-to-digital converter derives the first digital code by successive approximation in a first number of bit test cycles, wherein
the first number of bit test cycles is less than a second number of bits in the first numerical representation of the sampled analog voltage, and
the first number of bit test cycles is equal to or greater than a third number of bits in the second numerical representation of the sampled analog voltage.

19. The analog-to-digital converter system of claim 1 wherein the generator circuit comprises a cellular-automata-shift-register circuit configured to provide a pseudo random sequence.

20. The analog-to-digital converter system of claim 1 wherein the generator circuit comprises a linear-feedback-shift-register circuit configured to provide a pseudo random sequence.

* * * * *